United States Patent [19]

Menon

[11] Patent Number: 5,485,571
[45] Date of Patent: Jan. 16, 1996

[54] METHOD AND APPARATUS FOR PROVIDING DISTRIBUTED SPARING WITH UNIFORM WORKLOAD DISTRIBUTION IN FAILURES

[75] Inventor: Jaishankar M. Menon, San Jose, Calif.

[73] Assignee: International Business Machines Corporation, Armonk, N.Y.

[21] Appl. No.: 173,441

[22] Filed: Dec. 23, 1993

[51] Int. Cl.$^6$ .................................................. G06F 11/20
[52] U.S. Cl. ........................................................ 395/182.05
[58] Field of Search .......................... 371/10.2, 4, 40.1, 371/40.4, 11.1, 10.1, 182.05; 395/650, 575; 364/268.5, 269.2

[56] References Cited

U.S. PATENT DOCUMENTS

| | | | |
|---|---|---|---|
| 4,949,326 | 8/1990 | Takagi et al. | 369/54 |
| 5,101,492 | 3/1992 | Schultz et al. | 395/575 |
| 5,166,936 | 11/1992 | Ewert et al. | 371/21.6 |
| 5,167,032 | 11/1992 | Martin et al. | 395/575 |
| 5,185,746 | 2/1993 | Tanaka et al. | 371/40.1 |
| 5,185,884 | 2/1993 | Martin et al. | 395/575 |
| 5,195,100 | 3/1993 | Katz et al. | 371/66 |
| 5,208,813 | 5/1993 | Stallmo | 371/10.1 |
| 5,233,584 | 8/1993 | Kulakowski et al. | 369/44.27 |
| 5,233,618 | 8/1993 | Glider et al. | 371/68.1 |
| 5,235,601 | 8/1993 | Stallmo et al. | 371/40.1 |
| 5,258,984 | 11/1993 | Menon et al. | 371/10.1 |
| 5,265,098 | 11/1993 | Mattson et al. | 371/11.1 |
| 5,271,012 | 12/1993 | Blaum et al. | 371/101 |
| 5,301,297 | 10/1993 | Menon et al. | 395/425 |
| 5,303,244 | 11/1993 | Watson | 371/10.1 |
| 5,331,646 | 2/1992 | Krueger et al. | 371/40.1 |

Primary Examiner—Robert W. Beausoliel, Jr.
Assistant Examiner—Stephen Elmore
Attorney, Agent, or Firm—Baker, Maxham, Jester & Meador

[57] ABSTRACT

Data regions, parity regions, and spare regions in a redundant array of storage units are distributed such that each storage unit in the array has the same number of parity regions before, during, and after a failure of one or more storage units such that there is a uniform workload distribution among the storage units during normal operation, during the rebuild process, and during operation after the rebuild and before repair or replacement of the failed unit. The array provides uniform workload distribution for one or more failures of storage units. The number of storage units and the number of storage regions per storage unit is specified once the number of regions in a parity group and the number of failures to be managed are specified. The data regions, parity regions, and spare regions are then placed to provide the uniform workload distribution. Data, parity, and spare regions also can be distributed across multiple redundant arrays to provide the failure-tolerant advantages with uniform workload distribution.

12 Claims, 18 Drawing Sheets

PRIOR ART

| STORAGE UNIT 1 | STORAGE UNIT 2 | STORAGE UNIT 3 | STORAGE UNIT 4 |
|---|---|---|---|
| D1  | D1  | P1  | S1  |
| D2  | P2  | D2  | S2  |
| P3  | D3  | D3  | S3  |
| D4  | D4  | P4  | S4  |
| D5  | P5  | D5  | S5  |
| P6  | D6  | D6  | S6  |
| D7  | D7  | P7  | S7  |
| D8  | P8  | D8  | S8  |
| P9  | D9  | D9  | S9  |
| D10 | D10 | P10 | S10 |
| D11 | P11 | D11 | S11 |
| P12 | D12 | D12 | S12 |

FIG. 1

PRIOR ART

| STORAGE UNIT 1 | STORAGE UNIT 2 | STORAGE UNIT 3 | STORAGE UNIT 4 |
|---|---|---|---|
| D1  | D1  | P1  | S1  |
| D2  | P2  | S2  | D2  |
| P3  | S3  | D3  | D3  |
| S4  | D4  | D4  | P4  |
| D5  | D5  | P5  | S5  |
| D6  | P6  | S6  | D6  |
| P7  | S7  | D7  | D7  |
| S8  | D8  | D8  | P8  |
| D9  | D9  | P9  | S9  |
| D10 | P10 | S10 | D10 |
| P11 | S11 | D11 | D11 |
| S12 | D12 | D12 | P12 |

FIG. 2

PRIOR ART

| STORAGE UNIT 1 | STORAGE UNIT 2 | STORAGE UNIT 3 | STORAGE UNIT 4 |
|---|---|---|---|
| D1 | -- | P1 | $D1_2$ |
| D2 | -- | $P2_2$ | D2 |
| P3 | -- | D3 | D3 |
| $D4_2$ | -- | D4 | P4 |
| D5 | -- | P5 | $D5_2$ |
| D6 | -- | $P6_2$ | D6 |
| P7 | -- | D7 | D7 |
| $D8_2$ | -- | D8 | P8 |
| D9 | -- | P9 | $D9_2$ |
| D10 | -- | $P10_2$ | D10 |
| P11 | -- | D11 | D11 |
| $D12_2$ | -- | D12 | P12 |

FIG. 3

| STORAGE UNIT 1 | STORAGE UNIT 2 | STORAGE UNIT 3 | STORAGE UNIT 4 |
|---|---|---|---|
| D1 | D1 | P1 | S1 |
| D2 | P2 | D2 | S2 |
| P3 | D3 | D3 | S3 |
| D4 | D4 | S4 | P4 |
| D5 | P5 | S5 | D5 |
| P6 | D6 | S6 | D6 |
| D7 | S7 | D7 | P7 |
| D8 | S8 | P8 | D8 |
| P9 | S9 | D9 | D9 |
| S10 | D10 | D10 | P10 |
| S11 | D11 | P11 | D11 |
| S12 | P12 | D12 | D12 |

FIG. 4

| STORAGE UNIT 1 | STORAGE UNIT 2 | STORAGE UNIT 3 | STORAGE UNIT 4 |
|---|---|---|---|
| D1    | -- | P1    | D1$_2$ |
| D2    | -- | D2    | P2$_2$ |
| P3    | -- | D3    | D3$_2$ |
| D4    | -- | D4$_2$ | P4    |
| D5    | -- | P5$_2$ | D5    |
| P6    | -- | D6$_2$ | D6    |
| D7    | -- | D7    | P7    |
| D8    | -- | P8    | D8    |
| P9    | -- | D9    | D9    |
| D10$_2$ | -- | D10   | P10   |
| D11$_2$ | -- | P11   | D11   |
| P12$_2$ | -- | D12   | D12   |

FIG. 5

| STORAGE UNIT 1 | STORAGE UNIT 2 | STORAGE UNIT 3 | STORAGE UNIT 4 |
|---|---|---|---|
| D1 | D1 | P1 | -- |
| D2 | P2 | D2 | -- |
| P3 | D3 | D3 | -- |
| D4 | D4 | P4 | -- |
| D5 | P5 | D5 | -- |
| P6 | D6 | D6 | -- |
| D7 | D7 | P7 | -- |
| D8 | P8 | D8 | -- |
| P9 | D9 | D9 | -- |
| D10 | D10 | P10 | -- |
| D11 | P11 | D11 | -- |
| P12 | D12 | D12 | -- |

FIG. 6

| STORAGE UNIT 1 | STORAGE UNIT 2 | STORAGE UNIT 3 | STORAGE UNIT 4 |
|---|---|---|---|
| D1  | D1  | P1  | S1 |
| D2  | P2  | D2  | S2 |
| P3  | D3  | D3  | S3 |
| D4  | D4  | P4  | -- |
| D5  | P5  | D5  | -- |
| P6  | D6  | D6  | -- |
| D7  | D7  | P7  | -- |
| D8  | P8  | D8  | -- |
| P9  | D9  | D9  | -- |
| D10 | D10 | P10 | -- |
| D11 | P11 | D11 | -- |
| P12 | D12 | D12 | -- |

FIG. 7

| STORAGE UNIT 1 | STORAGE UNIT 2 | STORAGE UNIT 3 | STORAGE UNIT 4 |
|---|---|---|---|
| D1  | D1  | P1  | S1 |
| D2  | P2  | D2  | S2 |
| P3  | D3  | D3  | S3 |
| D4  | D4  | S4  | P4₃ |
| D5  | P5  | S5  | D5₃ |
| P6  | D6  | S6  | D6₃ |
| D7  | D7  | P7  | -- |
| D8  | P8  | D8  | -- |
| P9  | D9  | D9  | -- |
| D10 | D10 | P10 | -- |
| D11 | P11 | D11 | -- |
| P12 | D12 | D12 | -- |

FIG. 8

| STORAGE UNIT 1 | STORAGE UNIT 2 | STORAGE UNIT 3 | STORAGE UNIT 4 |
|---|---|---|---|
| D1 | D1 | P1 | S1 |
| D2 | P2 | D2 | S2 |
| P3 | D3 | D3 | S3 |
| D4 | D4 | S4 | P4$_3$ |
| D5 | P5 | S5 | D5$_3$ |
| P6 | D6 | S6 | D6$_3$ |
| D7 | S7 | D7$_2$ | P7$_3$ |
| D8 | S8 | P8$_2$ | D8$_3$ |
| P9 | S9 | D9$_2$ | D9$_3$ |
| D10 | D10 | P10 | -- |
| D11 | P11 | D11 | -- |
| P12 | D12 | D12 | -- |

FIG. 9

| STORAGE UNIT 1 | STORAGE UNIT 2 | STORAGE UNIT 3 | STORAGE UNIT 4 |
|---|---|---|---|
| D1 | D1 | P1 | S1 |
| D2 | P2 | D2 | S2 |
| P3 | D3 | D3 | S3 |
| D4 | D4 | S4 | $P4_3$ |
| D5 | P5 | S5 | $D5_3$ |
| P6 | D6 | S6 | $D6_3$ |
| D7 | S7 | $D7_2$ | $P7_3$ |
| D8 | S8 | $P8_2$ | $D8_3$ |
| P9 | S9 | $D9_2$ | $D9_3$ |
| S10 | $D10_1$ | $D10_2$ | $P10_3$ |
| S11 | $D11_1$ | $P11_2$ | $D11_3$ |
| S12 | $P12_1$ | $D12_2$ | $D12_3$ |

FIG. 10

| STORAGE UNIT 1 | STORAGE UNIT 2 | STORAGE UNIT 3 | STORAGE UNIT 4 | STORAGE UNIT 5 |
|---|---|---|---|---|
| D1 | D1 | P1 | S1 | |
| D2 | P2 | D2 | S2 | |
| P3 | D3 | D3 | S3 | |
| D4 | D4 | S4 | P4 | |
| D5 | P5 | S5 | D5 | |
| P6 | D6 | S6 | D6 | |
| D7 | S7 | D7 | P7 | |
| D8 | S8 | P8 | D8 | |
| P9 | S9 | D9 | D9 | |
| S10 | D10 | D10 | P10 | |
| S11 | D11 | P11 | D11 | |
| S12 | P12 | D12 | D12 | |
| D13 | D13 | P13 | S13 | |
| D14 | P14 | D14 | S14 | |
| P15 | D15 | D15 | S15 | |
| D16 | D16 | S16 | P16 | |
| D17 | P17 | S17 | D17 | |
| P18 | D18 | S18 | D18 | |
| D19 | S19 | D19 | P19 | |
| D20 | S20 | P20 | D20 | |
| P21 | S21 | D21 | D21 | |
| S22 | D22 | D22 | P22 | |
| S23 | D23 | P23 | D23 | |
| S24 | P24 | D24 | D24 | |
| D25 | D25 | P25 | S25 | |
| D26 | P26 | D26 | S26 | |
| P27 | D27 | D27 | S27 | |
| . | . | . | . | |
| . | . | . | . | |
| . | . | . | . | |
| D55 | S55 | D55 | P55 | |
| D56 | S56 | P56 | D56 | |
| P57 | S57 | D57 | D57 | |
| S58 | D58 | D58 | P58 | |
| S59 | D59 | P59 | D59 | |
| S60 | P60 | D60 | D60 | |

FIG. 11

| STORAGE UNIT 1 | STORAGE UNIT 2 | STORAGE UNIT 3 | STORAGE UNIT 4 | STORAGE UNIT 5 |
|---|---|---|---|---|
| D1  | D1  | P1  | S1  | Z1  |
| D2  | P2  | D2  | S2  | Z2  |
| P3  | D3  | D3  | S3  | Z3  |
| D4  | D4  | S4  | P4  | Z4  |
| D5  | P5  | S5  | D5  | Z5  |
| P6  | D6  | S6  | D6  | Z6  |
| D7  | S7  | D7  | P7  | Z7  |
| D8  | S8  | P8  | D8  | Z8  |
| P9  | S9  | D9  | D9  | Z9  |
| S10 | D10 | D10 | P10 | Z10 |
| S11 | D11 | P11 | D11 | Z11 |
| S12 | P12 | D12 | D12 | Z12 |
| D13 | D13 | P13 | S13 | |
| D14 | P14 | D14 | S14 | |
| P15 | D15 | D15 | S15 | |
| D16 | D16 | S16 | P16 | |
| D17 | P17 | S17 | D17 | |
| P18 | D18 | S18 | D18 | |
| D19 | S19 | D19 | P19 | |
| D20 | S20 | P20 | D20 | |
| P21 | S21 | D21 | D21 | |
| S22 | D22 | D22 | P22 | |
| S23 | D23 | P23 | D23 | |
| S24 | P24 | D24 | D24 | |
| D25 | D25 | P25 | S25 | |
| D26 | P26 | D26 | S26 | |
| P27 | D27 | D27 | D27 | |
| . | . | . | . | |
| . | . | . | . | |
| . | . | . | . | |
| D55 | S55 | D55 | P55 | |
| D56 | S56 | P56 | D56 | |
| P57 | S57 | D57 | D57 | |
| S58 | D58 | D58 | P58 | |
| S59 | D59 | P59 | D59 | |
| S60 | P60 | D60 | D60 | |

FIG. 12

| STORAGE UNIT 1 | STORAGE UNIT 2 | STORAGE UNIT 3 | STORAGE UNIT 4 | STORAGE UNIT 5 |
| --- | --- | --- | --- | --- |
| D1 | D1 | P1 | S1 | Z1 |
| D2 | P2 | D2 | S2 | Z2 |
| P3 | D3 | D3 | S3 | Z3 |
| D4 | D4 | S4 | P4 | Z4 |
| D5 | P5 | S5 | D5 | Z5 |
| P6 | D6 | S6 | D6 | Z6 |
| D7 | S7 | D7 | P7 | Z7 |
| D8 | S8 | P8 | D8 | Z8 |
| P9 | S9 | D9 | D9 | Z9 |
| S10 | D10 | D10 | P10 | Z10 |
| S11 | D11 | P11 | D11 | Z11 |
| S12 | P12 | D12 | D12 | Z12 |
| D13 | D13 | P13 | Z13 | S13 |
| D14 | P14 | D14 | Z14 | S14 |
| P15 | D15 | D15 | Z15 | S15 |
| D16 | D16 | S16 | Z16 | P16 |
| D17 | P17 | S17 | Z17 | D17 |
| P18 | D18 | S18 | Z18 | D18 |
| D19 | S19 | D19 | Z19 | P19 |
| D20 | S20 | P20 | Z20 | D20 |
| P21 | S21 | D21 | Z21 | D21 |
| S22 | D22 | D22 | Z22 | P22 |
| S23 | D23 | P23 | Z23 | D23 |
| S24 | P24 | D24 | Z24 | D24 |
| D25 | D25 | P25 | S25 | |
| D26 | P26 | D26 | S26 | |
| P27 | D27 | D27 | S27 | |
| . | . | . | . | |
| . | . | . | . | |
| . | . | . | . | |
| D55 | S55 | D55 | P55 | |
| D56 | S56 | P56 | D56 | |
| P57 | S57 | D57 | D57 | |
| S58 | D58 | D58 | P58 | |
| S59 | D59 | P59 | D59 | |
| S60 | P60 | D60 | D60 | |

FIG. 13

| STORAGE UNIT 1 | STORAGE UNIT 2 | STORAGE UNIT 3 | STORAGE UNIT 4 | STORAGE UNIT 5 |
|---|---|---|---|---|
| D1 | D1 | P1 | S1 | Z1 |
| D2 | P2 | D2 | S2 | Z2 |
| P3 | D3 | D3 | S3 | Z3 |
| D4 | D4 | S4 | P4 | Z4 |
| D5 | P5 | S5 | D5 | Z5 |
| P6 | D6 | S6 | D6 | Z6 |
| D7 | S7 | D7 | P7 | Z7 |
| D8 | S8 | P8 | D8 | Z8 |
| P9 | S9 | D9 | D9 | Z9 |
| S10 | D10 | D10 | P10 | Z10 |
| S11 | D11 | P11 | D11 | Z11 |
| S12 | P12 | D12 | D12 | Z12 |
| D13 | D13 | P13 | Z13 | S13 |
| D14 | P14 | D14 | Z14 | S14 |
| P15 | D15 | D15 | Z15 | S15 |
| D16 | D16 | S16 | Z16 | P16 |
| D17 | P17 | S17 | Z17 | D17 |
| P18 | D18 | S18 | Z18 | D18 |
| D19 | S19 | D19 | Z19 | P19 |
| D20 | S20 | P20 | Z20 | D20 |
| P21 | S21 | D21 | Z21 | D21 |
| S22 | D22 | D22 | Z22 | P22 |
| S23 | D23 | P23 | Z23 | D23 |
| S24 | P24 | D24 | Z24 | D24 |
| D25 | D25 | Z25 | P25 | S25 |
| D26 | P26 | Z26 | D26 | S26 |
| P27 | D27 | Z27 | D27 | S27 |
| . | . | . | . | |
| . | . | . | . | |
| . | . | . | . | |
| D55 | S55 | D55 | P55 | |
| D56 | S56 | P56 | D56 | |
| P57 | S57 | D57 | D57 | |
| S58 | D58 | D58 | P58 | |
| S59 | D59 | P59 | D59 | |
| S60 | P60 | D60 | D60 | |

FIG. 14

| STORAGE UNIT 1 | STORAGE UNIT 2 | STORAGE UNIT 3 | STORAGE UNIT 4 | STORAGE UNIT 5 |
|---|---|---|---|---|
| D1  | D1  | P1  | S1  | Z1  |
| D2  | P2  | D2  | S2  | Z2  |
| P3  | D3  | D3  | S3  | Z3  |
| D4  | D4  | S4  | P4  | Z4  |
| D5  | P5  | S5  | D5  | Z5  |
| P6  | D6  | S6  | D6  | Z6  |
| D7  | S7  | D7  | P7  | Z7  |
| D8  | S8  | P8  | D8  | Z8  |
| P9  | S9  | D9  | D9  | Z9  |
| S10 | D10 | D10 | P10 | Z10 |
| S11 | D11 | P11 | D11 | Z11 |
| S12 | P12 | D12 | D12 | Z12 |
| D13 | D13 | P13 | Z13 | S13 |
| D14 | P14 | D14 | Z14 | S14 |
| P15 | D15 | D15 | Z15 | S15 |
| D16 | D16 | S16 | Z16 | P16 |
| D17 | P17 | S17 | Z17 | D17 |
| P18 | D18 | S18 | Z18 | D18 |
| D19 | S19 | D19 | Z19 | P19 |
| D20 | S20 | P20 | Z20 | D20 |
| P21 | S21 | D21 | Z21 | D21 |
| S22 | D22 | D22 | Z22 | P22 |
| S23 | D23 | P23 | Z23 | D23 |
| S24 | P24 | D24 | Z24 | D24 |
| D25 | D25 | Z25 | P25 | S25 |
| D26 | P26 | Z26 | D26 | S26 |
| P27 | D27 | Z27 | D27 | S27 |
| . | . | . | . | . |
| . | . | . | . | . |
| . | . | . | . | . |
| Z55 | D55 | S55 | D55 | P55 |
| Z56 | D56 | S56 | P56 | D56 |
| Z57 | P57 | S57 | D57 | D57 |
| Z58 | S58 | D58 | D58 | P58 |
| Z59 | S59 | D59 | P59 | D59 |
| Z60 | S60 | P60 | D60 | D60 |

FIG. 15

| STORAGE UNIT 1 | STORAGE UNIT 2 | STORAGE UNIT 3 | STORAGE UNIT 4 | STORAGE UNIT 5 | STORAGE UNIT 6 | STORAGE UNIT 7 |
| --- | --- | --- | --- | --- | --- | --- |
| D1 | D1 | P1 | D1 | D1 | P1 | S1 |
| D2 | P2 | D2 | D2 | P2 | D2 | S2 |
| P3 | D3 | D3 | P3 | D3 | D3 | S3 |
| D4 | D4 | P4 | D4 | D4 | S4 | P4 |
| D5 | P5 | D5 | D5 | P5 | S5 | D5 |
| P6 | D6 | D6 | P6 | D6 | S6 | D6 |
| D7 | D7 | P7 | D7 | S7 | D7 | P7 |
| D8 | P8 | D8 | D8 | S8 | P8 | D8 |
| P9 | D9 | D9 | P9 | S9 | D9 | D9 |
| D10 | D10 | P10 | S10 | D10 | D10 | P10 |
| D11 | P11 | D11 | S11 | D11 | P11 | D11 |
| P12 | D12 | D12 | S12 | P12 | D12 | D12 |
| D13 | D13 | S13 | P13 | D13 | D13 | P13 |
| D14 | P14 | S14 | D14 | D14 | P14 | D14 |
| P15 | D15 | S15 | D15 | P15 | D15 | D15 |
| D16 | S16 | D16 | P16 | D16 | D16 | P16 |
| D17 | S17 | P17 | D17 | D17 | P17 | D17 |
| P18 | S18 | D18 | D18 | P18 | D18 | D18 |
| S19 | D19 | D19 | P19 | D19 | D19 | P19 |
| S20 | D20 | P20 | D20 | D20 | P20 | D20 |
| S21 | P21 | D21 | D21 | P21 | D21 | D21 |

FIG. 17

METHOD AND APPARATUS FOR PROVIDING DISTRIBUTED SPARING WITH UNIFORM WORKLOAD DISTRIBUTION IN FAILURES

BACKGROUND OF THE INVENTION

1. Field of the Invention

This invention relates generally to computer system data storage and, more particularly, to the distribution of data regions in a redundant array of storage units in a computer system.

2. Description of the Related Art

Conventional computing systems include a central processing unit (CPU) and multiple storage devices connected to the CPU either directly or through a control unit and a data channel. Storage units store data that the CPU accesses in performing data processing tasks. Access to the data in a storage unit is gained through reading data from the storage unit, writing data to the storage unit, or both. A great variety of storage units can be used. Typical large capacity computing systems use tape units and disk drives. The disk drives can be magnetic, optical, semiconductor, or some combination of technologies. If there is a failure of one such storage unit, then the entire computing system can be shut down and the data stored on the failed storage unit can be lost.

It is very important for computing systems to have great reliability and efficiency. Therefore, a number of schemes are used to recover from the failure of a storage unit and permit the computing system to continue with data processing tasks. Conventionally, the needed reliability is provided by redundant arrays of independent storage units, such as disk drives, in which a computing system having a number of primary storage units is provided with one or more spare storage units. The spare storage units provide a means of duplicating or rebuilding the data stored in a failed primary unit.

One such redundancy scheme is to duplicate the number of storage units provided and to duplicate the data stored in them, providing a fully redundant system. That is, all data write operations are duplicated in that each data write operation to a primary storage unit is duplicated with a write operation to a corresponding secondary unit. All read operations can be accomplished with a read to the primary unit or the secondary unit or can alternate between primary and secondary units. If one storage unit or another fails, then the data and function of the failed unit are simply replaced with the remaining unit until the computing system can be temporarily shut down for repairs, whereupon a new storage unit is provided or the failed unit is repaired and the data from the remaining unit is copied to the replaced or repaired unit. The likelihood of two independent storage units failing simultaneously or in a small time interval before repair can be effected is relatively small. In this way, the reliability of the computing system is increased and there is minimal interruption to system operations from a storage unit failure.

Unfortunately, providing duplicate storage units can be very costly, because the number of storage units needed for a storage array of a computing system is doubled, and is very inefficient, because the number of write operations that must be executed is doubled. It is known to reduce the number of spare storage units required while still providing redundancy through the use of the exclusive-OR (XOR) logical operator to generate parity information for a group of data regions. Under the XOR redundancy concept, data stored in the storage units of a redundant array is organized into equally sized address areas referred to generally as regions, each storage unit having the same number of regions. The regions can comprise, for example, a disk block, disk track, disk cylinder, tape record, or the like. The regions are organized into parity groups having the same address ranges across the storage units. The XOR operation is performed on all the data regions of a parity group and the result is placed in a parity region of a last storage unit. An additional storage unit provides a corresponding spare region for the parity group.

If there is a storage unit failure, then the data from the failed unit is recovered by performing the XOR operation on the remaining data regions in the parity group and on the parity region of the parity group. The result of the repeated XOR operations provides the data from the failed storage unit. This result is stored on the corresponding spare region of the spare storage unit. In this way, the data from the failed storage unit is rebuilt parity group-by-parity group onto the spare storage unit. Eventually, the computing system can be temporarily shut down for repairs and the failed unit replaced. Until the shut down occurs, however, the computing system can continue with data processing with a minimum of interruption required for the rebuild process itself. In this way, only one spare storage unit is necessary, not counting the storage unit needed for parity information.

It should be clear that a redundancy scheme using parity and a single spare storage unit is much more cost-effective than providing duplicate storage units, especially for very large computing systems. It is not uncommon, for example, to have ten or more disk drives in a disk array of a large computing system. In such a computing system, the parity redundancy scheme described above would reduce the number of storage units necessary from twenty to twelve. Unfortunately, some inefficiencies remain.

Each write operation to any one of the data storage units requires generating new parity information and writing the new parity information to the parity storage unit in addition to the data write operation. That is, with each write of new data, the old parity information stored on the parity storage unit must be read and XOR'd with the old data to "remove" the parity information from the old data and the resulting sum must then be XOR'd with the new data to generate the new parity information. The new parity information is then written to the parity region of the parity storage unit. This process is referred to as a "read-modify-write" process. Thus, the parity storage unit is disproportionately burdened with write operations as compared with the remaining storage units of the array, as a write operation to any one of the data storage units results in a write operation to the parity storage unit. This extra work adds significantly to the work load of the parity storage unit. In addition to being inefficient, the extra work also results in more frequent maintenance to the parity storage unit and can result in more frequent failures of the parity storage unit.

To more uniformly distribute the write operation workload among the data storage units and parity storage unit, it is known to evenly distribute the parity regions among the storage units. In any parity group, one region of one storage unit is designated a parity region for the remaining data regions of the group. The designated parity region is rotated among the storage units in successive parity groups. Such a storage scheme is generally referred to as dedicated sparing or, in the case of disk arrays, by the acronym "RAID-5" (the term "RAID" denoting redundant arrays of inexpensive disks).

A dedicated sparing distribution of regions is illustrated in FIG. 1, where a data region "m" in a storage unit "n" is represented by Dm in column n and a similar notation scheme is used for parity regions P and spare regions S. In the FIG. 1 array, having three storage units and a spare storage unit, the parity region P1 for the first parity group is stored in the first region of the third storage unit, the parity region for the second parity group is stored in the second region of the second unit, and the parity region for the third group is stored in the third region of the first unit. The cycle is repeated for additional regions as the parity region precesses among the storage units for successive parity groups. Thus, the parity region for the fourth parity group is stored in the fourth region of the third storage unit, the parity region for the fifth parity group is stored in the fifth region of the second unit, and so forth.

It has been noted that, in a disk array with a designated spare storage unit, the spare unit is not used in normal operation and increased efficiency can be gained by distributing the regions from the spare unit among the storage units in the array. Such a distributed sparing scheme is illustrated in FIG. 2. In the FIG. 2 array, there are twelve parity groups and three regions in each group. Thus, each storage unit includes six data regions, three parity regions, and three spare regions. It should be apparent that write operations among the data regions and parity regions in a parity group will be equally distributed in terms of read-modify-write processes.

While a more uniform distribution of write workload is achieved with distributed sparing, some unequal distribution of workload still can remain during the rebuild process, after a failure and before the repair or replacement of a failed storage unit. This is illustrated in FIG. 3, which depicts the array of FIG. 2 after the second storage unit has failed and the rebuild process has been completed using the spare regions and reconstructing missing data by using the XOR operation. In FIG. 3, the regions that have been rebuilt are designated by the notation Dm, for data regions, where m is the number of the parity region and n is the number of the storage unit from which the data region was derived. A similar notation scheme is used for the rebuilt parity regions.

Storage Unit 2 included six data regions, three parity regions, and three spare regions. Therefore, with respect to the rebuilding process, it should be clear that nine regions must be rebuilt, as the now-missing spare regions $S3_2$, $S7_2$, and $S11_2$ of Storage Unit 2 (FIG. 2) need not be rebuilt. Rebuilding D1 of Storage Unit 2 is achieved by reading D1 from Storage Unit 1 and P1 from Storage Unit 3, XOR'ing those regions together to generate the $D1_2$ information, and writing the result to Storage Unit 4. Rebuilding $P2_2$, is achieved by reading D2 from Storage Unit 1 and D2 from Storage Unit 4, XOR'ing those regions together, and writing the result to Storage Unit 3. The remaining regions are rebuilt in a similar fashion. Thus, rebuilding the missing regions requires one access operation to each of the three remaining storage units and the rebuilding workload is evenly distributed among the remaining storage units.

After the rebuilding process is completed, the distribution of regions appears as depicted in FIG. 3. It should be noted that Storage Unit 1 has nine data regions and three parity regions, Storage Unit 3 has six data regions and six parity regions, and Storage Unit 4 has nine data regions and three parity regions. That is, it just so happened that all of the parity regions that were on Storage Unit 2 were moved to Storage Unit 3 during the rebuild process. Storage Unit 3 now has a disproportionate share of the parity regions so that the write workload in connection with the read-modify-write process is not uniformly distributed. It would be advantageous if data regions, parity regions, and spare regions were distributed so that workload was evenly divided among the storage units of an array before, during, and after a failure of one or more units. The problem of uneven workload distribution can become more complicated, and more uneven, if more than one storage unit fails.

From the discussion above, it should be apparent that there is a need for a redundant array of storage units that provides uniform workload distribution among the storage units before, during, and after one or more storage unit failures so that the rebuild process does not result in uneven distribution of workload in connection with read-modify-write processes. The present invention satisfies this need.

SUMMARY OF THE INVENTION

In accordance with the invention, data regions, parity regions, and spare regions in a redundant array of storage units are distributed such that each storage unit in the array has the same number of parity regions before, during, and after a failure of one or more storage units, thereby providing a uniform workload distribution among the storage units during normal operation, during the rebuild process, and during operation after the rebuild and before repair or replacement of the failed unit(s). A distribution of data regions, parity regions, and spare regions in the single failure case can be easily applied recursively to manage multiple failures of storage units and ensure uniform workload distribution. In accordance with the invention, the number of storage units and the total number of regions per storage unit is determined once the number of regions in a parity group and the number of failures to be managed are specified. In this way, multiple failures of storage units in a redundant storage unit array can be managed such that the write workload is uniformly distributed among the storage units before and after one or more failures and also during the rebuild process itself.

In general, where the redundant storage unit array is to store data organized across storage units into parity groups having a total of n regions, comprising n-1 data regions and one parity region per parity group, if "f" is the number of storage unit failures to be managed, then in accordance with the invention the storage unit array is provided with n+f storage units and each storage trait is provided with n×(n+1)×(n+2)× . . . ×(n+f) storage locations. Assignment of data and parity regions to the storage locations is initially made in what is commonly referred to as a distributed parity pattern across the first n storage units, ignoring the remaining storage units. Next, spare regions are assigned across the first n+1 storage units in blocks of n, with rotation. That is, blocks of n spare regions are assigned and the assignments of blocks of n data and parity regions are rotated to the right across the storage units as the spare region block assignments take their place and precess across the storage units. This helical pattern is repeated until the spare region assignments have been distributed across the first n+1 storage units. Similarly, spare regions are assigned in blocks of n×(n+1) across the first n+2 storage units with rotation until spare regions have been assigned across the first n+2 storage units. Next, spare regions are assigned in blocks of n×(n+1)×(n+2) across the first n + storage units. This pattern is repeated recursively until spare regions have been assigned across all n+f storage units. The resulting distribution of data, parity, and spare regions provides each storage unit with an equal number of data, parity, and spare regions before and after the failure of up to "f" storage units and also during the rebuild process itself.

Other features and advantages of the present invention should be apparent from the following description of the preferred embodiments, which illustrate, by way of example, the principles of the invention.

BRIEF DESCRIPTION OF THE DRAWINGS

FIG. 1 is a representation of a prior art distribution of regions in a redundant array of storage units using dedicated sparing.

FIG. 2 is a representation of a prior art distribution of regions in a redundant array of storage units using distributed sparing.

FIG. 3 is a representation of the FIG. 2 redundant array after a failure of Storage Unit 2 and completion of the rebuild process.

FIG. 4 is a representation of a distribution of regions in a redundant array of storage units in accordance with the present invention.

FIG. 5 is a representation of the FIG. 4 redundant array after a failure of Storage Unit 2 and completion of the rebuild process.

FIGS. 6, 7, 8, 9, and 10 are representations of steps followed in generating the distribution of regions illustrated in FIG. 4.

FIGS. 11, 12, 13, 14, and 15 are representations of steps followed in generating a distribution of regions that provides a uniform workload distribution in the case of multiple storage unit failures.

FIG. 17 is a representation of a distribution of regions in a double-array configuration of storage units in accordance with the present invention.

DESCRIPTION OF THE PREFERRED EMBODIMENTS

Figure 16:
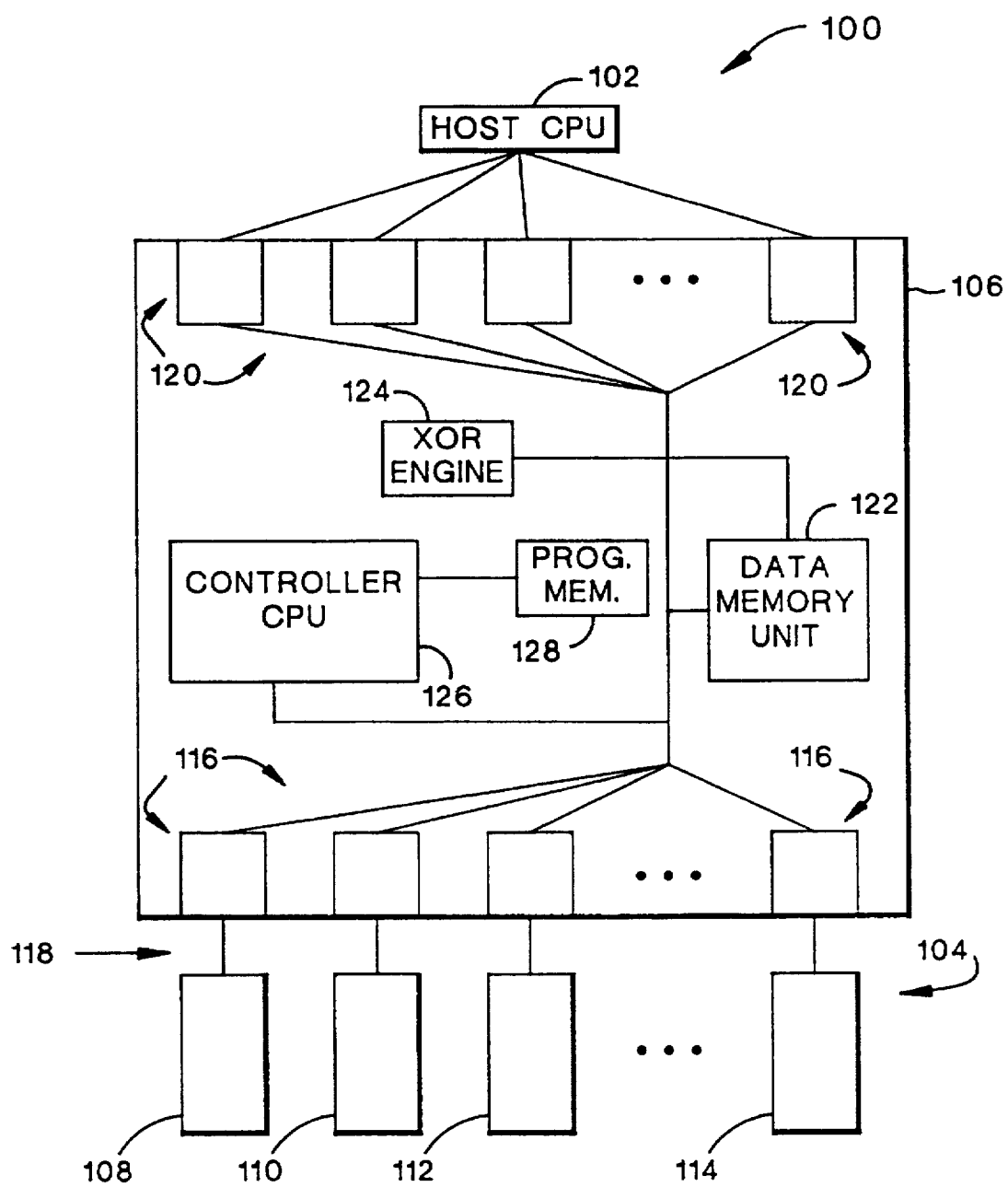
FIG. 16 is a block diagram of a computing system having a redundant array of independent disks with a distribution of storage regions in accordance with the present invention.

With reference to FIG. 4, a representation of a storage unit array shows the distribution of data, parity, and spare regions in accordance with the present invention for an array having four storage units. The storage units can comprise, for example, disk drives, tape drives, or semiconductor memory units. The regions can comprise, for example, disk blocks, disk tracks, disk cylinders, tape records, or the like. Data regions are denoted by Dn, parity regions by Pn, and spare regions by Sn, where n is the respective region number of a storage unit. Inspection of FIG. 4 shows that each storage unit includes six data regions, three parity regions, and three spare regions. Thus, the workload distribution in terms of read-modify-write sequences is uniformly distributed among the storage units. The FIG. 4 representation is to manage a single failure of a storage unit and still provide uniform workload distribution. FIG. 5 shows the array after Storage Unit 2 has failed, as indicated by the dashes in the Storage Unit 2 column where regions were previously indicated in FIG. 4, and the rebuild process has been completed using the exclusive-OR (XOR) logical operator. Inspection of FIG. 5 shows that each storage unit includes eight data regions and four parity regions. Thus, the workload distribution remains uniformly distributed among the storage units even after a failure.

The rebuild process is completed in accordance with the conventional practice of first organizing storage regions into parity groups having the same address ranges across the storage units and generating a parity region for a parity group by performing an XOR operation repeatedly on the data information in the data regions. The parity regions permit recovering information in a missing data region by performing the XOR operation on the remaining data and parity regions. The rebuild process is completed for a given parity group when the result of the XOR recovery operation is stored in the spare region for the parity group. Thus, in FIG. 5, the missing data region from the first parity group of Storage Unit 2 (denoted by "$D1_2$") is recovered by performing an XOR operation on the D1 region of Storage Unit 1 and the P1 region of Storage Unit 3 (represented by the notation "$D1_1$ XOR $P1_3$") and placing the $D1_2$ result in what formerly was the S1 region (FIG. 4) of the first parity group.

In a similar fashion, the missing parity region from the second parity group of Storage Unit 2 can be recovered by performing a $D2_1$ XOR $D2_3$ operation and placing the $P2_2$ result in the spare region S2 (FIG. 4) of the second parity group. The rebuild process is repeated for the remaining data and parity regions. It should be clear that the spare regions S7, S8, and S9 are not replaced. As noted above, when the rebuild process of the redundant array in accordance with the invention is completed, an equal number of data and parity regions remain on each of the storage units.

The process of providing the distribution of data, parity, and spare regions across storage units as in the FIG. 4 embodiment will be described with reference to FIGS. 6, 7, 8, 9, and 10. For purposes of illustration, the process of providing the distribution will be described in terms of "moving" the regions among the storage units and the "movement" will be noted with subscripts indicating the storage unit from which a region originated. In actuality, it is the assignment of storage locations as containing either data, parity, or spare information that can be thought of as being moved. That is, the distribution of regions in accordance with the invention is not produced by first storing data and parity information in regions of storage units and then moving them around. Therefore, it is to be understood that the following characterization of the process as involving the movement of regions is for purposes of illustration only.

The first step in providing a uniform distribution in accordance with the invention is to determine the required number of storage units and the number of regions per storage unit. The parity groups of the FIG. 4 embodiment comprise two data regions and one parity region. A failure of a single storage unit is to be managed. In general, where a parity group of the redundant storage unit array includes n regions comprising n–1 data regions and one parity region, if "f" is the number of storage unit failures to be managed, then in accordance with the invention the storage unit array is provided with n+f storage units and each storage unit is provided with n×(n+1)×(n+2)× . . . ×(n+f) regions. Therefore, the FIG. 4 array must be provided with n+f=4 storage units and each of the storage units must be provided with at least [n×(n+1)]=12 regions. If desired, the storage units may be provided with more than twelve regions each, so long as the regions are provided in multiples of twelve.

The next illustrative step in implementing the uniform distribution of the present invention, for the general case, is to distribute data and parity regions across the first n storage units in what is commonly referred to as a distributed parity pattern. FIG. 6 illustrates a distributed parity pattern for the first three storage units of the array. As indicated by the dashes in the Storage Unit 4 column, the storage units beyond the first n are not yet assigned regions.

Given the distributed parity pattern on the first three storage units, the next step is to begin distributing spare regions across the storage units. In general, the spare regions are next distributed across the first n+1=4 storage units in blocks of n=3 with rotation. That is, blocks of three data and parity regions are rotated to the right across the storage units as blocks of three spare regions take their place and precess across the storage units. This helical pattern is repeated until spare regions have been distributed across all storage units. Thus, in FIG. 7, a block of three spare regions is placed in the first three regions of Storage Unit 4. In FIG. 8, a block of three spare regions is placed in the second three regions of Storage Unit 3 and the three regions (P4$_3$, D5$_3$, and D6$_3$) displaced by the spare regions are moved to corresponding regions of Storage Unit 4. The original column location of the displaced regions is indicated in FIG. 8 by the subscripts.

Continuing the process of placing spare blocks with rotation, FIG. 9 shows a block of three spare regions placed in Storage Unit 2 with "precession," such that the spare regions are placed in the third block of three regions (regions 7, 8, and 9). The displaced regions from Storage Unit 2 are rotated to corresponding regions of Storage Unit 3, and the regions thereby displaced from Storage Unit 3 are rotated to corresponding unused regions of Storage Unit 4. Again, the original location of the displaced regions is indicated by subscripts. Finally, FIG. 10 shows the array after the last block of three spare regions has been placed in the last three regions of the first storage unit, Storage Unit 1, with the resulting displacement of regions originally in Storage Unit 1 to Storage Unit 2, regions originally in Storage Unit 2 to Storage Unit 3, and regions originally in Storage Unit 3 to Storage Unit 4. Inspection of FIG. 10 shows that the assignment of regions as containing either data, parity, or spare information is the same as the distribution illustrated in FIG. 4, having an equal number of data, parity, and spare regions on each storage unit before and after a single failure. Thus, if any one of the storage units failed, the rebuild process and the operation of the array thereafter would be such that the write workload among the storage units, in terms of read-modify-write operations, would be uniformly distributed.

A redundant array of storage units in accordance with the present invention also can accommodate multiple failures of storage units. Where the redundant storage unit array includes parity groups having a total of n regions, comprising n−1 data regions and one parity region per parity group, if "f" is the number of storage unit failures to be accommodated, then the array is provided with n+f storage units and each storage unit is provided with n×(n+1)×(n+2)× . . . ×(n+f) storage regions. A particular example of a distribution will be provided with reference to the two-failure distribution illustrated in FIGS. 11–15. That is, in the case of FIGS. 11–15, n=3 and f=2. Thus, in FIG. 11, n+f=5 storage units are provided and each storage unit is provided with n×(n+1)× (n+f)=3×4×5=60 regions. For ease of description, not all of the regions of the storage units are illustrated in the drawings. As before, it should be understood that more than sixty regions can be provided per storage unit, so long as the regions are provided in multiples of sixty.

To provide a multiple-failure-tolerant distribution of data, parity, and spare regions in accordance with the invention, the first step is to distribute the data, parity, and spare region assignments across the first n+1 storage units as described above in connection with FIGS. 6–10 for a single failure. In FIG. 6, the distribution pattern for the single failure case could be accommodated in twelve regions. To accommodate two failures, a total of sixty regions are needed. Thus, in FIG. 11, the distribution pattern for the single failure case must be repeated five times across the storage units. In general, the pattern will be repeated across the storage units n+2 times.

Next, spare regions are assigned to the first n×(n+1)=12 regions of the number n+2=5 storage unit, as illustrated in FIG. 12. Thus, a block of twelve spare regions denoted Zn, n=1, 2, . . . , 12 are assigned to the first twelve regions of Storage Unit 5. As before, this placement pattern is repeated recursively with rotation. Thus, in FIG. 13, a block of twelve more spare regions is assigned to the second twelve regions of Storage Unit 4 (regions 13 to 24) and the displaced regions from Storage Unit 4 are rotated to corresponding regions of Storage Unit 5. FIG. 14 illustrates part of the next block of regions (regions 25 to 36). The placement is continued with a block of spare regions covering regions 37 to 48 of the storage units (not illustrated) and the last block of spare regions is placed, covering regions 49 to 60, as partially illustrated in FIG. 15. Any regions not depicted in FIGS. 11–15 can be provided easily by those skilled in the art, in conjunction with this description of the process.

It should be apparent to those skilled in the art that the distribution depicted in FIG. 15 provides the five storage units with an equal number of data, parity, and spare blocks and therefore provides a uniform distribution of write workload among the storage units for the read-modify-write process of updating a redundant array. It also should be apparent that the uniform distribution of workload is maintained in the event of a single failure of a storage unit and also in the event of a second failure. Thus, the distribution illustrated in FIG. 15 provides a uniform workload distribution before and after multiple failures and during the rebuild process.

In view of the drawings and accompanying description above, a general process for providing a failure-tolerant distribution of data, parity, and spare regions across storage units of a redundant array can be specified as follows. Where a redundant array of independent storage units includes storage regions organized across storage units into parity groups such that "n" is the number of regions in a parity group, a parity group comprising n−1 data regions and one parity region, if "f" is the number of storage unit failures to be accommodated without interruption, then the storage unit array must be provided with [n+f] storage units and each storage unit must be provided with [n×(n+1)×(n+2)× . . . ×(n+f)] regions or multiples thereof.

Assignment of data and parity regions is initially made in what is commonly referred to as a distributed parity pattern across the first n storage units, ignoring the remaining storage units. FIG. 6, for example, illustrates a distributed parity arrangement for the first three storage units of a four-unit array. Next, the following assignment scheme is applied recursively: for the specified values of n and f, spare regions are repeatedly assigned in blocks of n×(n+1)×(n+2)× . . . ×(n+f−j), where j=f, f− 1, f−2, . . . , 3, 2, 1 and the blocks are assigned (with rotation) to the n+i storage unit with each iteration, where i=1, 2, 3, . . . , f. In any iteration, the pattern of assignments is repeated, if necessary, until all storage locations of the pertinent storage units are assigned.

Thus, after the distributed parity arrangement is completed on the first n storage units, spare regions are assigned to the n+1 storage unit in blocks of n, with rotation. That is, blocks of n spare regions are assigned beginning with the first n regions of the n+1 storage unit and precessing across the storage units, displacing the assignments of blocks of n data and parity regions and rotating the displaced blocks to the right across the storage units. This helical pattern is repeated until the spare region assignments have been distributed across the first n+1 storage units. In the illustrated embodiment, the assignment of spare regions precesses to the left in the storage unit representations. Those skilled in the art will appreciate that the assignment of spare regions also could precess to the right.

Next, spare regions are assigned in blocks of n×(n+1) across the first n+2 storage units with rotation until spare regions have been assigned across the first n+2 storage units. On the next iteration of the assignment scheme, spare regions are assigned in blocks of n×(n+1)×(n+2) across the first n+storage units. This scheme is repeated recursively until spare regions have been assigned across all n+f storage units. The resulting distribution of data, parity, and spare regions provides each storage unit with an equal number of data, parity, and spare regions before and after the failure of up to "f" storage units and also during the rebuild process itself.

FIG. 16 is a block diagram of a computing system that can implement the assignment of data, parity, and spare regions described above. The computing system 100 includes a host central processing unit (CPU) 102 and multiple storage units 104 connected to the host CPU through a controller 106. In FIG. 16, only four storage units 108, 110, 112, and 114 are shown for simplicity. The host CPU may comprise a large mainframe computer processor, such as an IBM Model 370 or 390, or can comprise smaller machines, such as an IBM Model RS6000 workstation or an IBM PC or IBM PS/2 personal computer. The storage units may comprise, for example, magnetic disk drive units, such as large mainframe-compatible IBM Model 3390 disk drives or SCSI-format IBM Model 0663-H12 magnetic disk drives, or may comprise magnetic tape drives, semiconductor memory units, or the like. The controller 106 can comprise, for example, an IBM Model 3990 disk controller. The interface between the controller and the storage units 104 is provided by a plurality of controller device ports 116, and by a data channel connection 118 between the ports and the storage units, such as the well-known SCSI interface or the well-known IPI interface. Only four of the device ports and data channel connections are shown, one for each of the storage units illustrated in FIG. 16.

Each of the device ports 116 of the controller 106 has a corresponding host port 120 that provides a connection for the flow of commands and data between the controller and the host CPU 102, such as the IBM Microchannel architecture or the IBM Model 370-format data channel. Again, only four of the ports are shown for simplicity. Data flows back and forth between the host ports and device ports through a data memory unit 122, as indicated by the solid line interconnecting these elements. As indicated in FIG. 16, data also flows between the data memory unit and an XOR engine 124. The XOR engine can be a special-purpose unit or may be implemented in software to provide dedicated exclusive-OR logical operations for use in computing parity regions for the read-modify-write operations and recovering lost data and parity regions during the rebuild process.

All of the operations of the controller 106 are carried out under the control of the controller central processing unit (CPU) 126, including data flow between the data memory unit 122, the device ports 116, the host ports 120, and the XOR engine 124. The controller CPU can retrieve the proper sequence of processing steps to follow in carrying out such operations from a program memory unit 128. Thus, the host CPU 102 can inform the controller CPU 126 of the configuration of the computing system 100. Such configuration could include the number of regions in a parity group, the number of 5 failures to be accommodated by the system, and the device characteristics of the storage units 104. The controller CPU can confirm that the system configuration can support the requirements of the failure-tolerant distribution of regions in accordance with the invention. An error indication is provided if the configuration is not suitable.

Assuming that the configuration is suitable, the controller CPU 126 can determine the appropriate assignment of data, parity, and spare regions on each of the storage units 104. As data is received from the host computer 102 via the data memory unit 122, the controller CPU can determine the appropriate address ranges in the storage units at which to place data and parity information. As noted above, the parity information can be determined from the XOR engine 124. The controller CPU monitors the status of the storage units and determines if there is a failure of one or more of the units. If there is a failure, the controller CPU carries out the rebuilding process as described above, directing XOR operations on data and parity regions and placing the resulting information in the appropriate spare regions. If a failure mode occurs that cannot be accommodated, such as where the system 100 is configured for accomodating double failures and a third storage unit fails, then the controller CPU provides an error indication. Operations then must be halted until repair can be effected.

The storage units controlled by the controller 106 can be arranged, if desired, as multiple redundant arrays of independent storage units. The process of assigning data, parity, and spare regions to the storage locations for a multiple array configuration is analogous to the process of assigning regions for a single array of storage units described above. The process is most easily understood with reference to the particular example of a computing system having two arrays of three storage units each, along with one spare storage unit, that will accommodate a single storage unit failure substantially without interruption following the rebuild process. With reference to FIG. 16, such a system would have seven storage units 104 and a corresponding number of device ports 116 and host ports 120. The result of assigning data, parity, and spare regions in the system in accordance with the present invention is illustrated in FIG. 17.

The system having two arrays of three storage units plus one spare, as illustrated in FIG. 17, can be described as having a total of kn+f storage units, where n is the parity group size, f is the number of failures to be accommodated, and k is the number of arrays. Thus, with respect to the system represented by FIG. 17, n=3, f=1, and k=2. In general, the number of storage units needed is given by kn+f, which in the case of the FIG. 17 system is seven. Each storage unit must include [n×(kn+1)×(kn+2)× . . . ×(kn+f)] storage locations, which in the case of the FIG. 17 system is given by 3×7=21. In a manner analogous to that described above, the controller 106 can determine the number of storage units needed and the number of storage locations required given the number of storage unit arrays, the parity group size, and the number of failures to be accommodated.

In providing the failure-tolerant distribution of data, parity, and spare regions in accordance with the invention, the controller 106 first assigns data and parity regions to the storage units of the arrays independently, with distributed parity, on the first kn storage units, ignoring the remaining storage units. Thus, in FIG. 17, the controller first assigns data and parity regions to the first six storage units, independently assigning the regions to the first three storage units and then to the second three storage units. Then, for the first n rows (n=parity group size), a block of n spare regions is assigned to the first n storage locations of the kn+1 storage unit. The next block of n spare regions is assigned to the next n storage locations of the kn storage unit, rotating the affected data and parity regions from the kn storage unit to the kn+1 storage unit. This process is repeated until all storage locations of the kn+1 storage unit have been assigned. The resulting distribution is depicted in FIG. 17.

Those skilled in the art will appreciate the process of providing a multiple array that can accommodate a plurality of storage unit failures, in view of the description and drawings above for the single array, multiple failure system of FIGS. 11–15 and the multiple array, single failure system of FIG. 17. For example, if multiple failures were to be accommodated, the next step in providing the distribution of regions would assign blocks of [n×(kn+1)] spare regions with rotation across the first kn+2 storage units. The next step in providing the distribution would assign blocks of [n×(kn+1)×(kn+2)] spare regions with rotation across the first kn+storage units. The process would be repeated until assignments were completed across all kn+f storage units. The distribution in accordance with the invention therefore can be carried out on a wide variety of storage unit configurations. A distribution of data, parity, and spare regions across multiple arrays of storage units provides an equal distribution of workload among the storage units in connection with the read-modify-write process, both before and after one or more failures of storage units.

Figure 18:
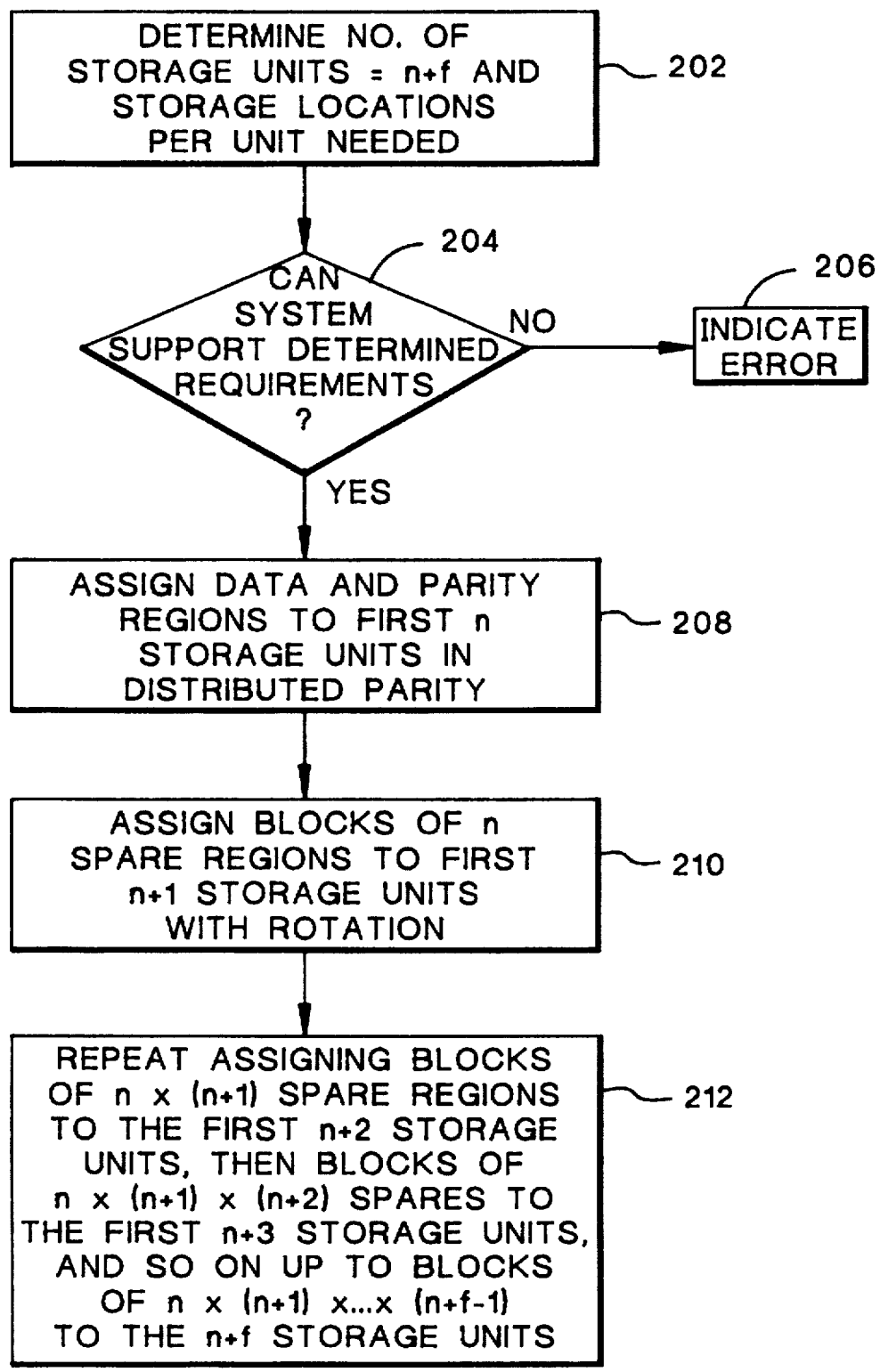
FIG. 18 is a flow diagram of the steps carried out by the system illustrated in FIG. 16 in achieving the distribution of storage regions in accordance with the invention.

FIG. 18 is a flow diagram that illustrates the steps carried out by the controller CPU in providing the distribution of data, parity, and spare regions that permits uniform distribution of write workload among the storage units in the event of storage unit failure. The steps can be implemented as a software process stored in the controller program memory. At the first flow diagram box numbered 202, the controller is informed of the failure requirements of the user and determines the number of storage units and regions on each storage unit needed to implement the failure requirements, as described above. This step involves becoming informed of the parity group size n and the number of failures to be accommodated f and determining if the system configuration can support the requirements of the failure-tolerant distribution scheme. The system configuration can be learned, for example, through direct interactive query of an operator or through automatic detection of system resources.

If the controller determines at the flow diagram box numbered 204 that the system configuration cannot accommodate the failure requirements, then at box 206 an error indication is provided. Assuming that the system resources are adequate, the controller next assigns data and parity regions to the first n storage units according to a distributed parity scheme, as indicated by the flow diagram box numbered 208. If the computing system includes multiple arrays of storage units, then the step at box 208 comprises assigning data and parity regions to each array with distributed parity, as described above in connection with FIG. 17.

Spare regions are next assigned in blocks of size n, with rotation, across the first n+1 storage units, kn+1 in the case of multiple arrays, providing a distribution scheme that will accommodate a single failure of a storage unit without interruption after the rebuild process, as described above. This assignment of spare regions is represented by flow diagram box 210. The assignment of spare regions is repeated as indicated by flow diagram box 212, which shows that, for the single array case, spare regions are assigned in blocks of [n×(n+1)] across the first n+2 storage units, then in blocks of [n×(n+1)×(n+2)] across the first n+storage units, and so on up to blocks of [n×(n+1)×(n+ 2)× . . . ×(n+f−1)] to the n+f storage units. As noted above, the assignment of spare regions for k multiple arrays that occurs in connection with flow diagram box 212 is carried out in blocks of [n×(kn+1)] across the first (kn+2) storage units, then in blocks of [n×(kn+1)×(kn+2)] across the first (kn+3) storage units, and so on up to blocks of [n×(kn+1)×(kn+2)× . . . ×(kn+f−1)] spare regions across the kn+f storage units.

In accordance with the steps of the FIG. 18 flow diagram, the resulting distribution of data, parity, and spare regions will provide an equal number of data regions, parity regions, and spare regions on each storage unit before and after storage unit failures, up to a predetermined number of failures. Thus, the write workload of the storage units in connection with read-modify-write operations of redundant arrays will be uniformly distributed. The uniform distribution of workload increases efficiency and improves reliability.

The present invention has been described above in terms of presently preferred embodiments so that an understanding of the present invention can be conveyed. There are, however, many configurations for storage media not specifically described herein but with which the present invention is applicable. The present invention should therefore not be seen as limited to the particular embodiments described herein, but rather, it should be understood that the present invention has wide applicability with respect to storage media generally. All modifications, variations, or equivalent arrangements that are within the scope of the attached claims should therefore be considered to be within the scope of the invention.

I claim:

1. In a computer system having a plurality of storage units in which data and parity information is stored and retrieved under control of a controller so as to comprise a redundant storage unit array with distributed sparing such that the controller executes a rebuild process in response to a failure of a storage unit and thereby reconstructs the data and parity information with no loss of information, wherein the controller stores the data and parity information into regions comprising equal-sized address areas, a predetermined number of regions equal to a number n comprises a parity group having n−1 data regions and one parity region, from which parity information to be stored in the parity region is produced for the rebuild process, a method or operating the controller comprising the steps of:

(A) determining if the number of storage units under control of the controller is equal to a number (n+f), wherein f is a maximum predetermined number of storage unit failures that will be permitted to occur with no loss of information, and providing an error indication if it is not;

(B) determining if the number of regions per storage unit is equal to a multiple of a number [n×(n+1)×(n+2)× . . . ×(n+f)] and providing an error indication if it is not;

(C) storing the parity and data information across the storage units in a read-write-modify process such that the parity and data information is stored in parity regions and data regions, respectively, in accordance with a storage pattern defined by the steps of (1) assigning the data regions and parity regions to storage locations of the first n storage units according to a distributed parity pattern until all regions of the first n storage units are assigned, and (2) repeatedly making an assignment of spare regions across the storage units in blocks of n×(n+1)×(n+2)×

... ×(n+f−j) regions, where j=f, f−1, f−2, ..., 3, 2, 1 such that the blocks of spare regions are assigned with rotation to the n+i storage unit with each repeated assignment, where i=1, 2, 3, ..., f, until all regions of the n+f storage units are assigned; and (D) storing and retrieving data and parity information from the storage units with the read-write-modify process in accordance with the storage pattern, whereby the data, parity, and spare regions are distributed such that the read-write-modify process workload will be equally distributed among the storage units during the storing and retrieving of information before, during, and after the rebuild process.

2. In a computer system having a plurality of storage units in which data and parity information is stored and retrieved under control of a controller so as to comprise at least one redundant storage unit array with distributed sparing such that the controller executes a rebuild process in response to a failure of a storage unit, wherein the controller stores information into storage unit regions comprising equal-sized address areas, a method of operating the controller comprising the steps of:

(A) determining if the number of storage units under control of the controller is equal to a number (kn+f), where k is a predetermined number of redundant arrays of storage units, n is a predetermined number of regions that comprises a parity group having n−1 data regions and one parity region, from which parity information to be stored in the parity region is produced for the rebuild process, and f is a predetermined maximum number of storage unit failures that will be permitted to occur with no loss of data or parity information;

(B) providing an error indication if the determined number of storage units is not equal to the number (kn+f);

(C) determining if the number of regions per storage unit is equal to a multiple of a number [n×(kn+1)×(kn+2)× ... ×(kn+f)] of regions per storage unit;

(D) providing an error indication if the number of regions per storage unit is not a multiple of the number [n×(kn+1)×(kn+2)× ... ×(kn+f)];

(E) storing the data and parity information across the storage units in a read-write-modify process such that the data and parity information is stored in data regions and parity regions, respectively, in accordance with a storage pattern defined by the steps of (1) making an assignment of data regions and parity regions to storage locations of the first kn storage units according to a distributed parity pattern for each array until all regions of the first kn storage units are assigned, and (2) repeatedly making an assignment of spare regions in blocks of n×(kn+1)×(kn+2)× ... ×(kn+f−j) regions, where j=f, f−1, f−2, ..., 3, 2, 1 such that the blocks of spare regions are assigned with rotation to the kn+i storage unit, where i=1, 2, 3, ..., f, until all regions of the kn+f storage units are assigned; and (F) storing and retrieving data and parity information from the storage units with the read-write-modify process in accordance with the storage pattern, whereby the data, parity, and spare regions are distributed such that the read-write-modify process workload will be equally distributed among the storage units during the storing and retrieving of information before, during, and after the rebuild process.

3. The method as defined in claim 2, wherein k=1 and the storage pattern definition step (2) of repeatedly making an assignment of spare regions comprises the steps of:

(a) assigning spare regions across the first n+1 storage units with rotation such that a block of n spare regions is assigned to the first n storage locations of the n+1 storage unit and then succeeding blocks of n spare regions are assigned with rotation such that the assignment of the n data and parity regions originally in the affected storage locations of a storage unit are rotated to corresponding storage locations of the next storage unit; and (b) iteratively repeating the assignment of spare regions, in blocks of [n×(n+1)×(n+2)× ... ×(n+f−1)] with each iteration, including one additional storage unit in the assignments with each iteration.

4. The method as defined in claim 3, wherein the step (a) of assigning spare regions comprises the steps of:

(i) assigning a block of n spare regions such that the spare regions are assigned to the first n storage locations of the n+1 storage unit;

(ii) assigning the next block of n spare regions to the n storage unit such that the spare regions are assigned to the second n storage locations of the n disk;

(iii) rotating the assignment of the block of n data and parity regions originally assigned to the affected storage locations of the n storage unit to corresponding unassigned storage locations of the n+1 disk; and (iv) repeating steps (ii) and (iii) for each block of n spare regions until spare regions have been assigned across all storage locations of the first n+1 storage units of the array.

5. The method as defined in claim 2, wherein the number k of storage unit arrays is greater than 1 and the storage pattern definition step (2) of repeatedly making an assignment of spare regions comprises the steps of:

(a) assigning spare regions across the first kn+1 storage units with rotation such that a block of kn spare regions is assigned to the first kn storage locations of the kn+1 storage unit and then succeeding blocks of kn spare regions are assigned with rotation such that the assignment of the kn data and parity regions originally in the affected storage locations of a storage unit are rotated to corresponding storage locations of the next storage unit; and (b) iteratively repeating the assignment of spare regions, in blocks of [n×(kn+1)×(kn+2)× ... ×(kn+f−1)] with each iteration, including one additional storage unit in the assignments with each iteration.

6. A method of operating a controller for a data storage array of a computer system having a plurality of storage units comprising a redundant array in which the controller stores and retrieves data and parity information in regions comprising equal-sized storage unit address areas organized into parity groups having a predetermined number of regions equal to a number n, with n−1 data regions and one parity region per parity group, calculates new parity information using a read-write-modify process for each modification of data information in a parity group using an exclusive-OR logical operator, and executes a rebuild process in response to a failure of one of the storage units such that information from a data region of a parity group otherwise lost due to the storage unit failure is recovered by using the exclusive-OR operator on the remaining information in the parity group, thereby ensuring that no information will be lost, the method comprising the steps of:

(A) determining if the number of storage units under control of the controller is equal to a number (kn+1), where k is a predetermined number of redundant arrays of storage units in the computer system, n is the number of regions that comprises a parity group, and f is a predetermined maximum number of storage unit failures that will be permitted to occur with no loss of data or parity information;

(B) providing an error indication if the determined number of storage units is not equal to the number (kn+f);

(C) determining if the number of regions per storage unit is equal to a multiple of a number $[n \times (kn+1) \times (kn+2) \times \ldots \times (kn+f)]$ of regions per storage unit, where k, n, and f are defined as recited in step (A);

(D) providing an error indication if the number of regions per storage unit is not a multiple of the number $[n \times (kn+1) \times (kn+2) \times \ldots \times (kn+f)]$; and (E) storing the data and parity information across the storage units in respective data regions and parity regions, along with dedicated spare regions, using a read-write-modify process such that the data regions, parity regions, and spare regions are distributed across the storage units such that spare regions are located in contiguous blocks in a pattern defined by repeated blocks or $[n \times (kn+1) \times (kn+2) \times \ldots \times (kn+f-j)]$ spare regions, where $j=f, f-1, f-2, \ldots, 3, 2, 1$ such that the blocks of spare regions precess across the storage units with rotation to the kn+i storage unit, where $i=1, 2, 3, \ldots, f$ whereby the read-write-modify process workload will be equally distributed among the storage units during the storing and retrieving of information before, during, and after the rebuild process.

7. A method of operating a controller as defined in claim 6, wherein the repeating pattern of data, parity, and spare regions defined in the step of storing the data and parity information can be described by an assignment process comprising the steps of:

(1) assigning data regions and parity regions to a first block of storage locations at the first kn storage regions according to a distributed parity pattern for each array until all regions of the first kn storage units are assigned, and (2) repeatedly making an assignment of spare regions in blocks of $n \times (kn+1) \times (kn+2) \times \ldots \times (kn+f-j)$ regions, where $j=f, f-1, f-2, \ldots, 3, 2, 1$ such that the blocks of spare regions are assigned with rotation to the kn+i storage unit, where $i=1, 2, 3, \ldots, f$, until all regions of the kn+f storage units are assigned.

8. A computing system comprising:

a plurality of storage units having storage locations in which data and parity information is stored and retrieved across the storage units in regions comprising equal-sized storage location address areas, wherein the storage units comprise a predetermined number k of redundant arrays and wherein a predetermined number of regions equal to a number n comprises a parity group with n-1 data regions and one parity region, from which parity information to be stored in the parity region is produced using an exclusive-OR logical operator such that information from a data region of a parity group otherwise lost due to the storage unit failure can be recovered by using the exclusive-OR operator on the remaining information in the parity group in a rebuild process, thereby ensuring that no information will be lost;

a data memory unit that stores data and parity information assigned to data regions and parity regions of the storage units;

an XOR engine that performs the exclusive-OR logical operator; and a storage unit controller that controls operation of the data memory unit and XOR engine, and assigns data, parity, and spare regions to the storage units such that each storage unit has a number of storage regions equal to a number $[n \times (kn+1) \times (kn+2) \times \ldots \times (kn+f)]$ or multiples thereof, such that the number of data, parity, and spare regions is uniformly distributed among the storage units before, during, and after a failure of one or more of the storage units.

9. A computing system as defined in claim 8, wherein the storage unit controller of the computing system further determines if the number of storage units in the computing system is equal to a number kn+f, where k is the predetermined number of redundant arrays into which the storage units are organized, n is the number of regions that comprises a parity group, and f is a predetermined maximum number of storage unit failures that will be permitted to occur with no loss of data or parity information, such that the storage unit controller provides an error indication if the determined number of storage units is not equal to the number kn+f.

10. A computing system as defined in claim 9, wherein the storage unit controller assigns data, parity, and spare regions across the storage units in accordance with a storage pattern defined by the steps of:

assigning data regions and parity regions to storage locations of the first kn storage units with a distributed parity pattern, array by array, and repeating the assignment pattern until all regions of the first kn storage units are assigned; and repeatedly assigning spare regions in blocks of $[n \times (kn+1) \times (kn+2) \times \ldots \times (kn+f-j)]$ regions, where $j=f, f-1, f-2, \ldots, 3, 2, 1$, such that the blocks of spare regions are assigned with rotation to the kn+i storage unit with each repeated assignment, where $i=1, 2, 3, \ldots, f$, until all regions of the storage units have been assigned.

11. A storage unit controller for use in a computing system that includes a plurality of storage units having storage locations in which the storage unit controller stores and retrieves data and parity information in regions comprising equal-sized storage location address areas organized into parity groups of predetermined size n with n-1 data regions and one parity region per parity group, the storage unit controller further comprising:

error check means for determining if the number of storage units in the computing system is equal to a number kn+f, where k is a predetermined number of redundant arrays into which the storage units are organized, n is the number of regions that comprises a parity group, and f is a predetermined maximum number of storage unit failures that will be permitted to occur with no loss of data or parity information, such that the error check means provides an error indication if the determined number of storage units is not equal to kn+f;

an XOR engine that performs an exclusive-OR logical operation; and a controller central processing unit that controls operation of the XOR engine for the transfer of data and assigns data, parity, and spare regions to the storage locations of the storage units such that each storage unit has $[n \times (kn+1) \times (kn+2) \times \ldots \times (kn+f)]$ storage locations or multiples thereof, and new parity information is calculated for each modification of a data region in a parity group using the exclusive-OR logical operation to permit recovering information lost from a data region of a parity group due to a storage unit failure by using the exclusive-OR operation on the remaining information in the parity group in a rebuilding process, such that the number of data, parity, and spare regions is uniformly distributed among the storage units before, during, and after a failure of one or more storage units.

12. A storage unit controller as defined in claim 11, wherein the storage unit controller assigns data, parity, and spare regions in accordance with a storage pattern defined by the steps of:

assigning data regions and parity regions to storage locations of the first kn storage units with a distributed parity pattern, array by array, and repeating the assignment pattern until all regions of the first kn storage units are assigned; and repeatedly assigning spare regions in blocks of [n×(kn+1)×(kn+2)×...×(kn+f−j)] regions, where j=f, f−1, f−2, ..., 3, 2, 1, such that the blocks of spare regions are assigned with rotation to the kn+i storage unit with each repeated assignment, where i=1, 2, 3, ..., f, until all regions of the storage units have been assigned.

* * * * *

UNITED STATES PATENT AND TRADEMARK OFFICE
CERTIFICATE OF CORRECTION

PATENT NO. : 5,485,571
DATED : January 16, 1996
INVENTOR(S) : Menon

It is certified that error appears in the above-indentified patent and that said Letters Patent is hereby corrected as shown below:

Column 12, line 45, change "method or operating" to --method of operating--.

Column 14, line 66, change "(kn+1)" to --(kn+f)
Column 15, line 22, change "or" to --of--.

Signed and Sealed this

Twenty-sixth Day of August, 1997

Attest:

BRUCE LEHMAN

Attesting Officer

Commissioner of Patents and Trademarks